United States Patent [19]

Dong et al.

[11] Patent Number: 5,535,228
[45] Date of Patent: Jul. 9, 1996

[54] DEVICE AND METHOD FOR ACHIEVING ROTATIONAL INVARIANCE IN A MULTI-LEVEL TRELLIS CODING SYSTEM

[75] Inventors: Ping Dong, Canton; M. Vedat Eyuboglu, Concord; George D. Forney, Jr., Cambridge, all of Mass.

[73] Assignee: Motorola, Inc., Schaumburg, Ill.

[21] Appl. No.: 518,128

[22] Filed: Aug. 22, 1995

Related U.S. Application Data

[63] Continuation of Ser. No. 19,723, Feb. 19, 1993, abandoned.

[51] Int. Cl.$^6$ .................................................. G06F 11/00
[52] U.S. Cl. ........................ 371/49.1; 371/43; 371/56; 375/242; 375/244; 375/265
[58] Field of Search .................... 371/49.1–49.4, 371/50.1, 51.1, 56, 48, 27, 43; 375/242, 244, 261, 265, 286

[56] References Cited

U.S. PATENT DOCUMENTS

| | | | |
|---|---|---|---|
| 4,807,253 | 2/1989 | Hagenauer et al | 375/57 |
| 4,873,701 | 10/1989 | Tretter | 375/27 |
| 4,891,823 | 1/1990 | Cole | 375/25 |
| 4,964,129 | 10/1990 | Bowden, III et al. | 371/40.2 |
| 4,964,130 | 10/1990 | Bowden, III et al. | 371/40.2 |
| 4,994,993 | 2/1991 | Asghar et al. | 371/30 |
| 5,023,889 | 6/1991 | Divsalar et al. | 371/43 |
| 5,115,453 | 5/1992 | Calderbank et al. | 371/43 |
| 5,150,381 | 9/1992 | Forney, Jr. et al. | 371/43 |
| 5,258,987 | 11/1993 | Wei | 371/43 |
| 5,307,377 | 4/1994 | Chouly et al. | 371/43 |

Primary Examiner—Hoa T. Nguyen
Assistant Examiner—Dieu-Minh Le
Attorney, Agent, or Firm—Darleen J. Stockley

[57] ABSTRACT

A device (100) and method (400) are set forth that provide a parity check that utilizes a nonlinear dependence upon bits other than the parity bit alone. The 4D 16-state Wei trellis code is made transparent to m-90 degree rotations by utilizing a parity generating unit that generates a parity check bit based on at least a second rotationally significant label bit. The parity check bit allows detection of errors in a first rotationally-significant label bit, i.e., allows for achievement of a rotationally transparent parity check.

50 Claims, 7 Drawing Sheets

FIG. 4

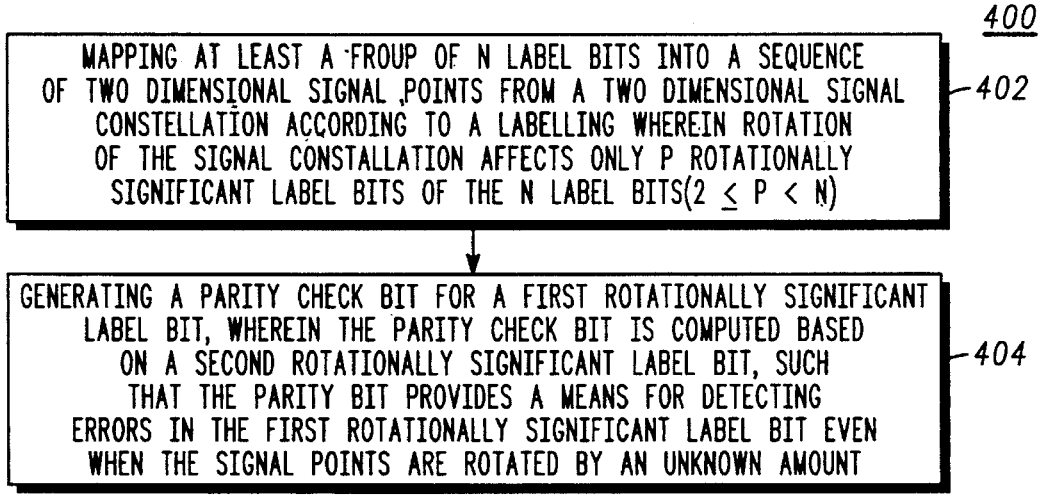

400

- 402 — MAPPING AT LEAST A GROUP OF N LABEL BITS INTO A SEQUENCE OF TWO DIMENSIONAL SIGNAL POINTS FROM A TWO DIMENSIONAL SIGNAL CONSTELLATION ACCORDING TO A LABELLING WHEREIN ROTATION OF THE SIGNAL CONSTELLATION AFFECTS ONLY P ROTATIONALLY SIGNIFICANT LABEL BITS OF THE N LABEL BITS ($2 \leq P < N$)

- 404 — GENERATING A PARITY CHECK BIT FOR A FIRST ROTATIONALLY SIGNIFICANT LABEL BIT, WHEREIN THE PARITY CHECK BIT IS COMPUTED BASED ON A SECOND ROTATIONALLY SIGNIFICANT LABEL BIT, SUCH THAT THE PARITY BIT PROVIDES A MEANS FOR DETECTING ERRORS IN THE FIRST ROTATIONALLY SIGNIFICANT LABEL BIT EVEN WHEN THE SIGNAL POINTS ARE ROTATED BY AN UNKNOWN AMOUNT

FIG. 5

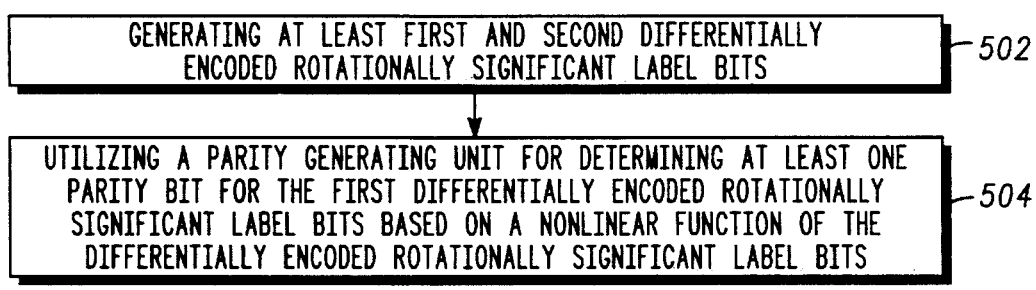

500

- 502 — GENERATING AT LEAST FIRST AND SECOND DIFFERENTIALLY ENCODED ROTATIONALLY SIGNIFICANT LABEL BITS

- 504 — UTILIZING A PARITY GENERATING UNIT FOR DETERMINING AT LEAST ONE PARITY BIT FOR THE FIRST DIFFERENTIALLY ENCODED ROTATIONALLY SIGNIFICANT LABEL BITS BASED ON A NONLINEAR FUNCTION OF THE DIFFERENTIALLY ENCODED ROTATIONALLY SIGNIFICANT LABEL BITS

FIG. 6

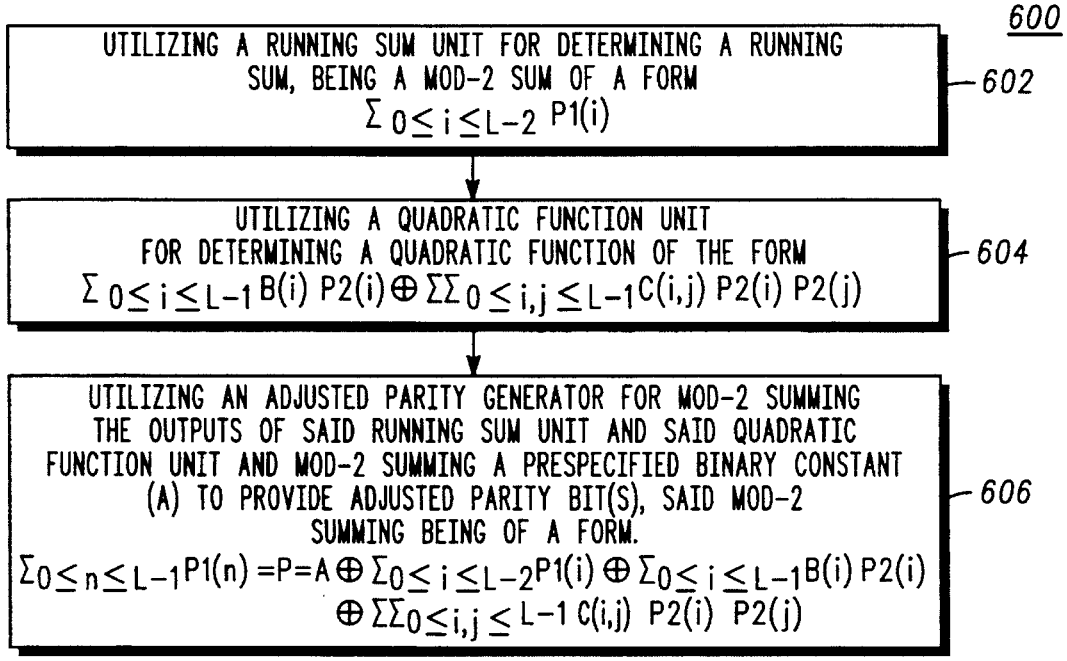

600

- 602 — UTILIZING A RUNNING SUM UNIT FOR DETERMINING A RUNNING SUM, BEING A MOD-2 SUM OF A FORM
$$\sum_{0 \leq i \leq L-2} P1(i)$$

- 604 — UTILIZING A QUADRATIC FUNCTION UNIT FOR DETERMINING A QUADRATIC FUNCTION OF THE FORM
$$\sum_{0 \leq i \leq L-1} B(i)\, P2(i) \oplus \sum\sum_{0 \leq i,j \leq L-1} C(i,j)\, P2(i)\, P2(j)$$

- 606 — UTILIZING AN ADJUSTED PARITY GENERATOR FOR MOD-2 SUMMING THE OUTPUTS OF SAID RUNNING SUM UNIT AND SAID QUADRATIC FUNCTION UNIT AND MOD-2 SUMMING A PRESPECIFIED BINARY CONSTANT (A) TO PROVIDE ADJUSTED PARITY BIT(S), SAID MOD-2 SUMMING BEING OF A FORM:
$$\sum_{0 \leq n \leq L-1} P1(n) = P = A \oplus \sum_{0 \leq i \leq L-2} P1(i) \oplus \sum_{0 \leq i \leq L-1} B(i)\, P2(i) \oplus \sum\sum_{0 \leq i,j \leq L-1} C(i,j)\, P2(i)\, P2(j)$$

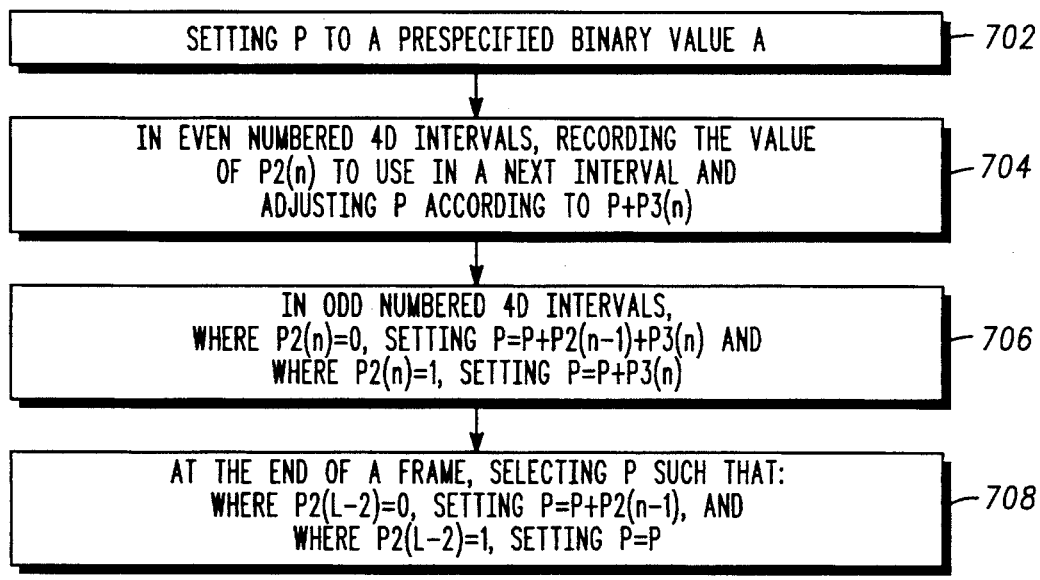

FIG. 7

- 702: SETTING P TO A PRESPECIFIED BINARY VALUE A
- 704: IN EVEN NUMBERED 4D INTERVALS, RECORDING THE VALUE OF P2(n) TO USE IN A NEXT INTERVAL AND ADJUSTING P ACCORDING TO P+P3(n)
- 706: IN ODD NUMBERED 4D INTERVALS, WHERE P2(n)=0, SETTING P=P+P2(n−1)+P3(n) AND WHERE P2(n)=1, SETTING P=P+P3(n)
- 708: AT THE END OF A FRAME, SELECTING P SUCH THAT: WHERE P2(L−2)=0, SETTING P=P+P2(n−1), AND WHERE P2(L−2)=1, SETTING P=P

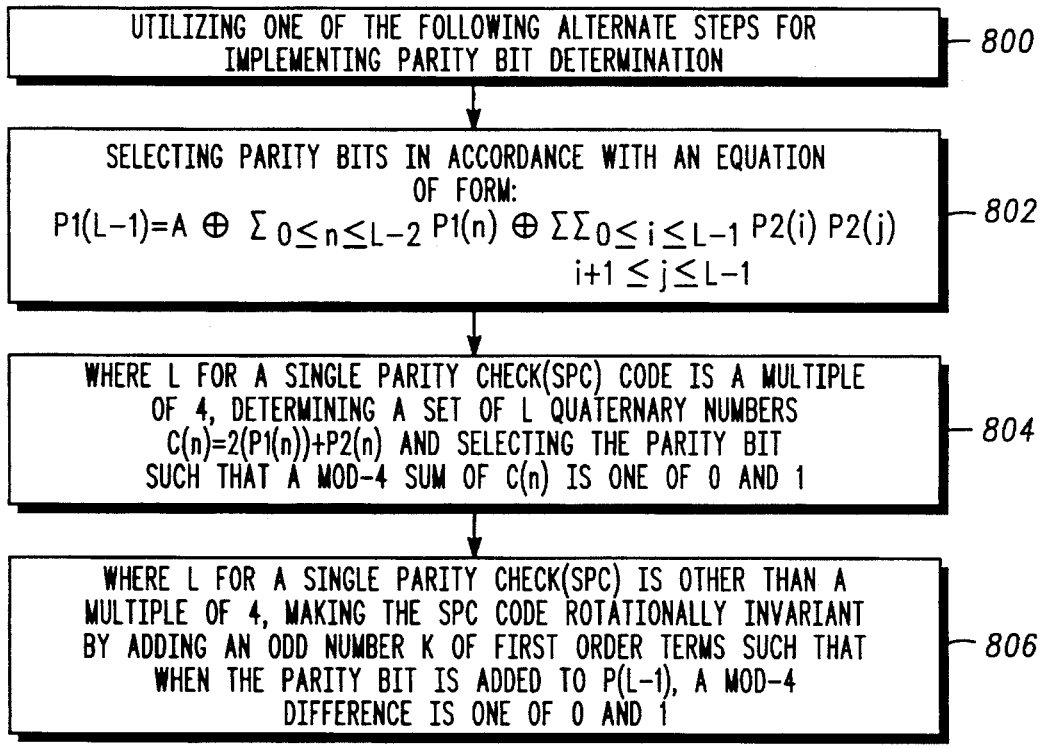

FIG. 8

- 800: UTILIZING ONE OF THE FOLLOWING ALTERNATE STEPS FOR IMPLEMENTING PARITY BIT DETERMINATION
- 802: SELECTING PARITY BITS IN ACCORDANCE WITH AN EQUATION OF FORM:
$$P1(L-1) = A \oplus \sum_{0 \leq n \leq L-2} P1(n) \oplus \sum\sum_{\substack{0 \leq i \leq L-1 \\ i+1 \leq j \leq L-1}} P2(i)P2(j)$$
- 804: WHERE L FOR A SINGLE PARITY CHECK(SPC) CODE IS A MULTIPLE OF 4, DETERMINING A SET OF L QUATERNARY NUMBERS $C(n)=2(P1(n))+P2(n)$ AND SELECTING THE PARITY BIT SUCH THAT A MOD-4 SUM OF C(n) IS ONE OF 0 AND 1
- 806: WHERE L FOR A SINGLE PARITY CHECK(SPC) IS OTHER THAN A MULTIPLE OF 4, MAKING THE SPC CODE ROTATIONALLY INVARIANT BY ADDING AN ODD NUMBER K OF FIRST ORDER TERMS SUCH THAT WHEN THE PARITY BIT IS ADDED TO P(L−1), A MOD-4 DIFFERENCE IS ONE OF 0 AND 1

DEVICE AND METHOD FOR ACHIEVING ROTATIONAL INVARIANCE IN A MULTI-LEVEL TRELLIS CODING SYSTEM

This is a continuation of U.S. patent application Ser. No. 08/019,723, filed Feb. 19, 1993, and now abandoned.

FIELD OF THE INVENTION

The present invention relates to carrier-modulated digital data transmission and more particularly to rotational invariance in a multi-level trellis-coded communication system.

BACKGROUND

In recent years several multi-dimensional trellis codes have been discovered which provide a better performance against Gaussian noise than two-dimensional trellis codes of similar complexity. Many good multi-dimensional trellis codes have minimum-distance error patterns which are only one or two symbol intervals long. Unless indicated otherwise, symbols herein are assumed to be two-dimensional.

When noise has a Gaussian distribution, the performance of the trellis code is determined by a minimum-distance of the trellis code, and the lengths of the minimum-distance error patterns do not directly affect the performance. However, when the noise probability density exhibits long tails (indicating a high probability for large noise peaks), the performance can be noticeably degraded when minimum-distance error patterns are very short. Therefore, for such noise, the advantage of such multi-dimensional trellis codes may be lost. In practice, large noise peaks may be caused by impulsive noise or by signal-dependent impairments such as non-linear distortion or pulse code modulation (PCM) noise found in the analog public switched telephone network (PSTN).

In multi-dimensional trellis codes, short minimum-distance error patterns are created by parallel transitions in the trellis diagram. A method which is known in the art as multi-level coding can eliminate these short minimum-distance error patterns. In multi-level coding, extra parity bits are added in the transmitter so that the receiver can detect and correct parallel transition errors. A special form of multi-level coding involves single parity-check (SPC) block codes.

In data transmission systems, the received signal points at the input of a decision device may be rotated relative to the transmitted signal points. This may be the result of either an initial carrier phase offset, or a sudden phase hit during data transmission. Signal constellations typically have phase ambiguities for phase rotations of 90°, 180° and 270°, which means that rotation takes a valid signal point to another valid signal point. Therefore, a decision-directed phase-locked loop, as typically employed in data transmission receivers, may lock onto a carrier phase that is offset by 90°, 180° or 270°. If the phase offset goes undetected, such phase offsets can create long strings of bit errors that may last indefinitely. In uncoded systems, such phase ambiguities can be eliminated easily using differential encoding techniques.

The problem is more complicated in a trellis coded system, where after the rotation, the resulting sequence of signal points may not be a valid trellis coded sequence. Many trellis codes have been discovered in recent years which are rotationally-invariant, so that if a sequence is rotated by m·90° (where m is an integer), another valid code sequence is obtained. Using differential encoding, these trellis codes can be made transparent to m·90° rotations.

When a second-level code is added to a rotationally-invariant trellis code, the resulting multi-level code may not be rotationally-invariant. Thus, there is a need for a device and a method for obtaining rotationally-invariant encoding of multi-level codes.

SUMMARY OF THE INVENTION

A device, and a method for utilizing the device, are set forth for encoding a sequence of groups of label bits into a sequence of two-dimensional signal points, mapping at least a group of n label bits into a sequence of two-dimensional signal points as described more fully below, and generating a parity bit such that the parity bit provides a means for detecting errors in the first rotationally-significant label bit even when the signal points are rotated by an unknown amount.

The device includes a mapper and a single-parity check code (SPC) unit. The mapper is utilized for mapping at least the group of n label bits into the sequence of two-dimensional signal points selected from a two-dimensional signal constellation according to a labelling wherein rotation of the signal constellation affects only p rotationally-significant label bits ($2 \leq p < n$; p, n integers) of the n label bits. The single-parity check code (SPC) unit is utilized for generating a parity check bit for a first rotationally-significant label bit, wherein the parity-check bit is computed based on at least a second rotationally-significant label bit.

BRIEF DESCRIPTIONS OF THE DRAWINGS

FIG. 4 is a flow chart showing steps of a first implementation of a method in accordance with the present invention.

FIG. 5 is a flow chart showing steps of a second implementation of a method in accordance with the present invention.

FIG. 6 is a flow chart showing steps of a third implementation of a method in accordance with the present invention.

FIG. 7 is a flow chart showing steps of a fourth implementation of a method in accordance with the present invention.

FIG. 8 illustrates a flow chart that shows alternative steps for implementing parity bit determination utilizing the SPC unit in FIG. 5 in accordance with the present invention.

FIG. 12 illustrates a 2D signal constellation with 192 points.

DETAILED DESCRIPTION OF A PREFERRED EMBODIMENT

In the present invention parity check bits are added to a trellis coded communication system in such a way that the combined multi-level coding system is rotationally invariant. With the present invention, the received bits will satisfy the parity-check equation even when the received signal sequence is rotated by a fixed, but unknown, phase amount of m·90°, where m is an integer.

Trellis coded modulation systems were developed to encode digital data as a sequence from a set of allowable sequences of signal points so that error performance of synchronous data links could be improved without decreasing data rate or requiring greater bandwidth. Allowable sequences are selected such that the minimum squared distance between the sequences is greater than the minimum squared distance between the signal points in the constellation. Signal points of each code sequence are interdependent, and not all possible sequences are allowable. A net coding gain is obtained since the additional average power used to send the code redundancies is less than the increase in minimum squared sequence distance.

Figure 1:
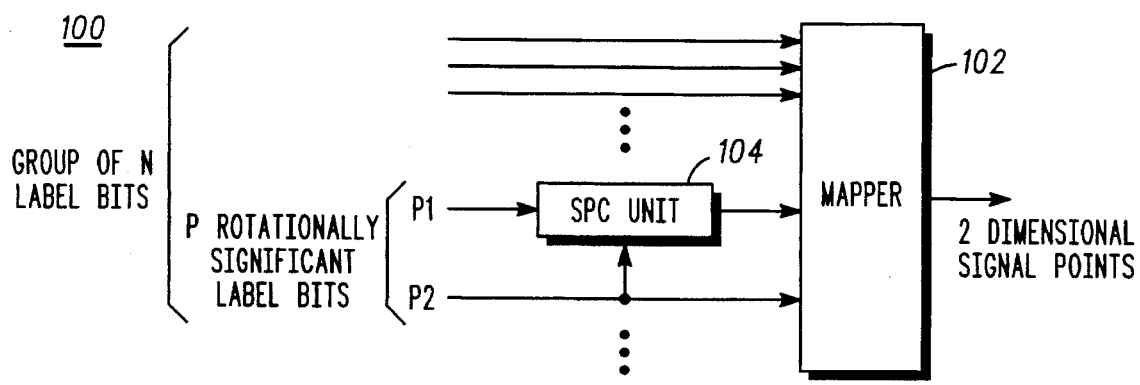
FIG. 1 is a block diagram of a first embodiment of the present invention for encoding a sequence of groups of label bits into a sequence of two-dimensional signal points in accordance with the present invention to provide a means for detecting errors in a first rotationally-significant label bit even when the signal points are rotated.

FIG. 1, numeral 100, is a block diagram of a first embodiment of the present invention for encoding a sequence of groups of label bits into a sequence of two-dimensional signal points in accordance with the present invention to provide a means for detecting errors in a first rotationally-significant label bit even when the signal points are rotated. The first embodiment includes a mapper (102) and a single-parity check code (SPC) unit (104).

A group of n label bits are mapped by the mapper (102) into a sequence of two-dimensional signal points selected from a two-dimensional signal constellation according to a labelling wherein rotation of the signal constellation affects only p rotationally-significant label bits ($2 \leq p < n$; p, n integers) of the n label bits. The single-parity check code (SPC) unit (104) is utilized for generating a parity check bit for a first rotationally-significant label bit, wherein the parity-check bit is computed based on at least a second rotationally-significant label bit, i.e., based on at least one of the p rotationally-significant label bits, and is input into the mapper (102).

Figure 2:
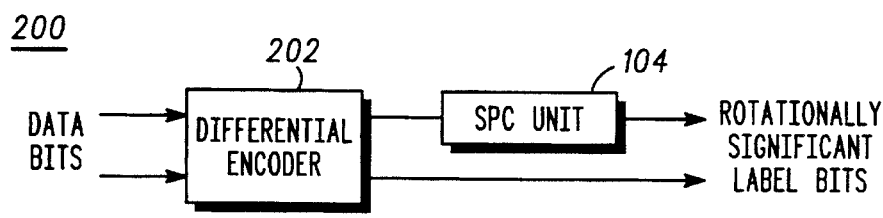
FIG. 2 is a block diagram of a second embodiment of the present invention for encoding a sequence of groups of label bits into a sequence of two-dimensional signal points in accordance with the present invention wherein a differential encoder is further utilized.

FIG. 2, numeral 200, is a block diagram of a second embodiment of the present invention for encoding a sequence of groups of label bits into a sequence of two-dimensional signal points in accordance with the present invention wherein a differential encoder is further utilized (mapper not shown). The device includes a differential encoder (202) and an SPC unit (104). The differential encoder (202) utilizes at least two data bits at a time to generate a first and second differentially-encoded rotationally-significant label bits. The SPC unit (104) is operably coupled to the differential encoder (202) and is utilized for determining at least a first parity bit for the first differentially-encoded rotationally-significant label bits based at least on a nonlinear function of the second differentially-encoded rotationally-significant label bits, such that said parity bit provides a means for detecting errors in the first differentially-encoded rotationally-significant label bits even when the signal points are rotated, i.e., even in the presence of an unknown phase offset.

Figure 3:
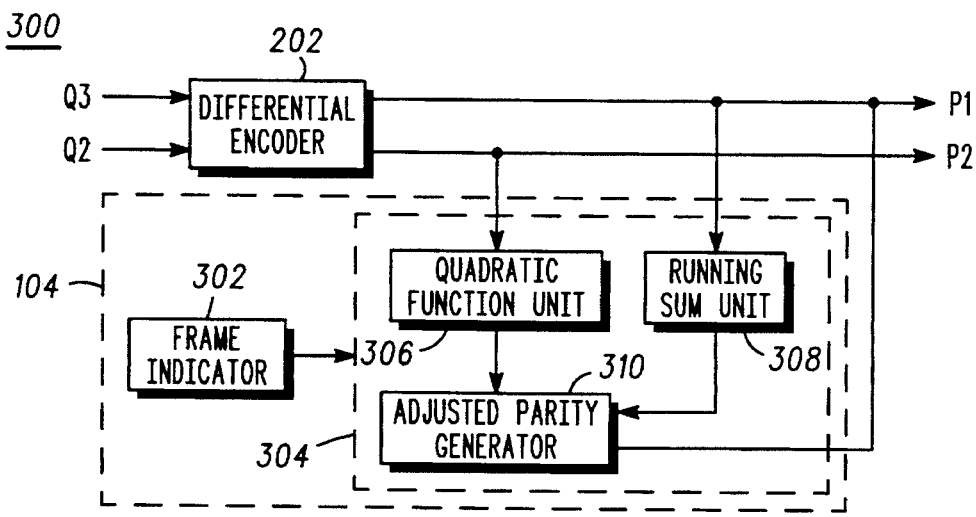
FIG. 3 is a block diagram of a third embodiment of the present invention for encoding a sequence of groups of label bits into a sequence of two-dimensional signal points in accordance with the present invention wherein the SPC unit includes a parity-generating unit and a frame indicator unit.

FIG. 3, numeral 300, is a block diagram of a third embodiment of the present invention illustrating the operation of the SPC unit (104) in more detail (mapper not shown). In this implementation, a parity generating unit (304) generates the parity bit for the SPC unit. The SPC unit further includes a frame indicator (302). The parity generating unit (304) includes a first running sum generation unit (308), a quadratic function unit (306), and an adjusted parity generator (310). The running sum unit (308) is operably coupled to receive a first set of differentially-encoded rotationally-significant label bits P1(i) from a differential encoder (202) and is utilized in every frame, as indicated by the frame indicator (302), for determining a mod-2 sum of the bits P1(i). The quadratic function unit (306) is operably coupled to receive a second set of differentially-encoded rotationally-significant label bits P2(i) from the differential encoder (202) for determining in every frame a mod-2 sum of a form:

$$\Sigma_{0 \leq i \leq L-1} B(i) P2(i) \oplus \Sigma\Sigma_{0 \leq i,j \leq L-1} C(i,j) P2(i) P2(j) \quad (1)$$

where l and j are integers, B(i) and C(i,j) are preselected binary constants, and L is a frame length. B(i) and C(i,j) are selected to ensure rotational invariance, described more fully below. The adjusted parity generator (310) is operably coupled to the running sum unit (308) and to the nonlinear quadratic function unit (306) for calculating the parity-check bit Pl(L−1)=P, where P represents the binary value such that the parity-check equation (1) is satisfied.

C(i,j) in the above equation can be chosen arbitrarily, provided that P2(n), for any integer n where $0 \leq n < L-1$, appears in the second-order terms an odd number of times, and B(i) are selected such that the total number of non-zero terms in the two summations is even. Then utilizing the adjusted parity bit(s) provides a frame of two-dimensional signal points that are rotationally-invariant with respect to the parity check.

For example, selecting C(i,j)=1 for odd values of i and with j=i−1, guarantees that each P2(n) will be non-zero once in the second-order terms, thus satisfying the first requirement. The total number of second-order terms is then L/2 (L/2 can be odd or even). If B(i) is selected to be equal to 1 for even n, the total number of non-zero terms in both summations will be L, which is assumed to be even. Thus, the rotational-invariance conditions are satisfied.

FIG. 4, numeral 400, is a flow chart showing steps of a first implementation of a method in accordance with the present invention. The method provides for encoding a sequence of groups of label bits into a sequence of two-dimensional signal points utilizing the device of FIG. 1 for mapping at least a group of n label bits into a sequence of two-dimensional signal points as described above and for generating a parity bit such that the parity bit provides a means for detecting errors in the first rotationally-significant label bit even when the signal points are rotated by an unknown amount. The method comprises the steps of (1) mapping at least a group of n label bits into a sequence of two-dimensional signal points selected from a two-dimensional signal constellation according to a labelling wherein rotation of the signal constellation affects only p rotationally-significant label bits ($2 \leq p < n$; p, n integers) of the n label bits (402), and (2) generating a parity check bit for a first rotationally-significant label bit, wherein the parity-check bit is computed based on at least a second rotationally-significant label bit, such that the parity bit provides a means for detecting errors in the first rotationally-significant label bit even when the signal points are rotated by an unknown amount (404). Exemplary implementations are described below.

FIG. 5, numeral 500, is a flow chart showing steps of a second implementation of a method in accordance with the present invention. The method provides for encoding a group of bits into a frame of two-dimensional signal points, comprising the steps of: (1) generating at least first and second differentially-encoded rotationally-significant label bits from at least two sets of data bits (502), and (2) determining at least a first parity bit for the first differentially-encoded rotationally-significant label bits based at least on a nonlinear function of the second differentially-encoded rotationally-significant label bits, such that said parity bit(s) enables detection of errors in the first differentially-encoded rotationally-significant label bits even when signal points are rotated (504).

FIG. 6, numeral 600, is a flow chart showing the detailed steps of a third implementation of a method for the SPC unit in accordance with the present invention. In this implementation, wherein the first and second differentially-encoded rotationally-significant label bits are P1 and P2, at the end of the frame, the parity bit is selected such that the adjusted parity bit(s) is/are determined in accordance with a mod-2 sum that is equal to a binary value P. In this implementation, utilizing the parity generating unit for determining at least a first parity bit for the first differentially-encoded rotationally-significant label bits such that said parity bit(s) enables detection of errors in the first differentially-encoded rotationally-significant label bits even when the signal points are rotated by an unknown amount comprises the steps of: (1) determining a running sum, being a mod-2 sum of a form:

$$\Sigma_{0 \leq i \leq L-2} P1(i)$$

where L is a frame length, i is an integer, (602), (2) determining a quadratic function of the form:

$$\Sigma_{0 \leq i \leq L-1} B(i) P2(i) \oplus \Sigma\Sigma_{0 \leq i,j \leq L-1} C(i,j) P2(i) P2(j)$$

where B(i) and C(i,j) are predetermined binary constants, i and j are integers, and L is the frame length (604), (3) mod-2 summing the outputs of said running sum unit and said quadratic function unit, and mod-2 summing a prespecified binary constant (A) to provide adjusted parity bit(s) to the differential encoder, said mod-2 summing being of a form:

$$\Sigma_{0 \leq n \leq L-1} P1(n) = P = A \oplus \Sigma_{0 \leq i \leq L-2} P1(i) \oplus \Sigma_{0 \leq i \leq L-1} B(i) P2(i) \oplus \Sigma\Sigma_{0 \leq i, j \leq L-1} C(i,j) P2(i) P2(j)$$

where A is a preselected binary constant, i and j are integers, B(i) and C(i,j) are preselected binary constants, and P2(n), for any integer n where $0 \leq n < L-1$, represents the second differentially encoded rotationally-significant label bits (606). The coefficients B(i) and C(i,j) are selected to provide that, for any n, P2(n) appears in the second-order terms an odd number of times, and B(i) are selected such that the total number of non-zero terms in the two summations is even, such that utilizing the adjusted parity bit(s) provides a frame of two-dimensional signal points that are rotationally-invariant with respect to the parity check.

FIG. 7, numeral 700, is a flow chart showing steps of a fourth implementation of a method for computing the parity bit(s) in accordance with the present invention. In this implementation, the parity-equation can also be written in the following form:

$$P1(L-1) = P = A \oplus \Sigma_{0 \leq n \leq L-2} P1(n) \oplus \Sigma_{0 \leq k \leq L/2-1} \overline{P2}(2k+1) P2(2k),$$

and P1(L−1)=P is recursively determined, where A is a preselected binary constant, n and k are integers, L is a frame length, P1(n) are the first differentially encoded rotationally-significant label bits, P2(2k), P2(2k+1) are successive bits from the second differentially encoded rotationally-significant label bits, and $\overline{P}_2$ (2k+1) is the logical inversion of P2(2k+1).

The parity bit P1(L−1)=P can also be calculated recursively as follows:

1. At the start of a frame, P is set to a pre-specified binary value, which is denoted as A (702).

2. In even-numbered 4D intervals (n=0, 2, 4, 6, ... ), the value of P2(n) is simply recorded to use in the next interval, and P is adjusted according to P=P⊕P1(n) (704).

3. In odd-numbered 4D intervals (n=1, 3, 5, or 7, ... , L−3) (706):
   if P2(n)=0, then P=P⊕P2(n−1)⊕P1(n), and
   if P2(n)=1, then P=P⊕P1(n).

4. At the end of a frame (n=L−1), P is chosen such that (708):
   if P2(L−2)=0, then P=P⊕P2(n−1), and if P2(L−2)=1, then P=P.

Alternatively, in equation (1) B(i) can be selected to be equal to 1 for odd values of n. This gives a different rotationally-invariant SPC code. It is also possible to set B(i) =1 for all n, or B(i)=0 for all n. However, in this case, L/2 has to be even, i.e., L has to be a multiple of 4. The choice of A is again arbitrary.

FIG. 8, numeral 800, illustrates a flow chart that shows alternative steps for implementing parity bit determination utilizing the parity generating unit in FIG. 4 in accordance with the present invention. Thus, an alternative step for choosing the parity bit(s) is determining the parity bit(s) in accordance with an equation of the form:

$$P1(L-1) = A \oplus \Sigma_{0 \leq n \leq L-2} P1(n) \oplus \Sigma\Sigma_{0 \leq i \leq L-1}\ P2(i)\ P2(j)\ _{i+1 \leq j \leq L-1}$$

(802). Since each P2(n), for any integer n where $0 \leq n \leq L-1$, appears only L−1 times (odd) and there are a total of L(L−1)/2 terms (even if L is a multiple of 4) in the summation, the SPC code will be rotationally invariant, if L is a multiple of 4. An equivalent implementation (804) of this SPC code is to define a set of L quaternary numbers C(n)=2·P1(n)+P2(n), n=0, 1, ... , L−1, and select the parity bit such that the mod-4 sum of C(n) is 0 or 1.

In the last example, when L is not a multiple of 4, the SPC code can be made rotationally invariant by adding an odd number K of first-order terms, since K+L(L−1)/2 is then even (806). In the mod-4 sum implementation, this is equivalent to forming a mod-4 sum of L−K numbers, then subtract (mod-4) the remaining K numbers. For instance, when L=10, first a mod-4 sum of C(0) through C(8) is formed, then C(9) mod-4 is subtracted. The parity bit is added to P1(9) so that the mod-4 difference is 0 or 1.

Figure 9:
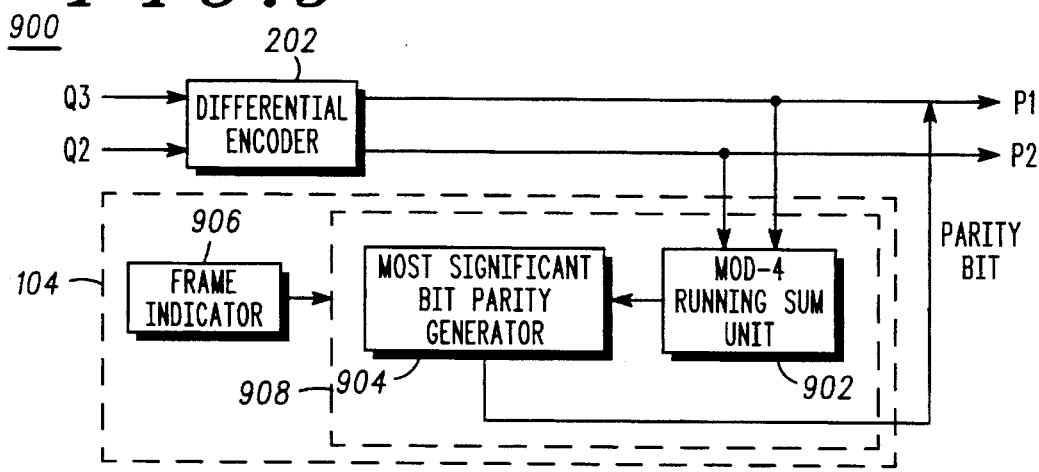
FIG. 9 illustrates a block diagram of a fourth embodiment of the present invention in accordance with utilizing the mod-4 running sum unit in the parity generating unit.

FIG. 9, numeral 900, illustrates a block diagram of a fourth embodiment of the present invention in accordance with utilizing a mod-4 running sum unit in the SPC unit (104). This embodiment comprises a differential encoder (202), a parity generating unit (908) and a frame indicator (906). The parity generating unit (908) includes a mod-4 running sum unit (902) and a most significant bit parity generator (MSB)(904). The differential encoder (202) is operably coupled to receive and differentially encode first and second data input bits. The mod-4 running sum unit (902) is operably coupled to receive and sum (as described below), as indicated by the frame indicator (906), the differentially-encoded rotationally-significant first and second successive label bits and to output a mod-4 running sum, which is used to compute the parity-check bit.

Figure 10:
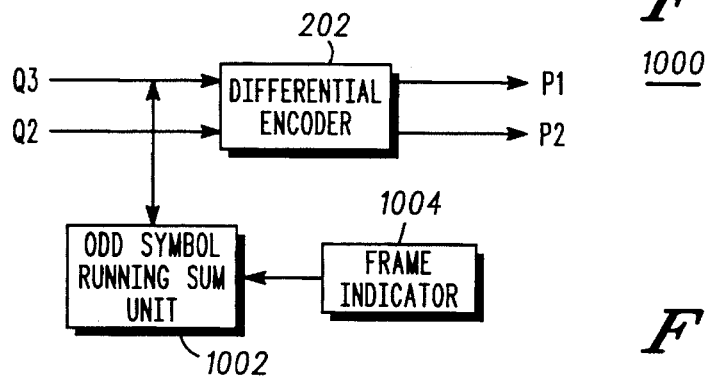
FIG. 10 illustrates a block diagram of a fifth embodiment in accordance with the present invention.

It is also possible to implement the parity-check method of the present invention by monitoring the rotationally-significant bit Q3 at the input of the differential encoder. In this fourth embodiment, illustrated in FIG. 10, numeral 1000, the parity generating unit comprises an odd-indexed bit running sum unit (1002) operably coupled to the frame indicator (1004) and to receive an odd-indexed bit Q3(i), i odd, before the differential encoder (202), for monitoring a running mod-2 sum of the bits of a frame and determining a parity bit such that $$Q3(L-1) = A \oplus \Sigma_{0 \leq k \leq L/2-2} Q3(2k+1) \quad (2)$$

where A is again a preselected binary constant. The frame indicator (1004), operably coupled to the odd-index running sum unit (1002), is used to determine the end of a frame. It is easy to verify that this formulation can be equivalent to the one which operates after the differential encoder. Here, it is assumed that the differential encoder operates as in FIG. 11, which will be described shortly.

In this approach, the receiver can perform the parity check after the differential decoder. If the parity is incorrect, a correction is made to the symbol before the differential decoder, and the differential decoder is run again after the correction. It is also possible to encode the SPC using one approach and decode it using the other.

Figure 11:
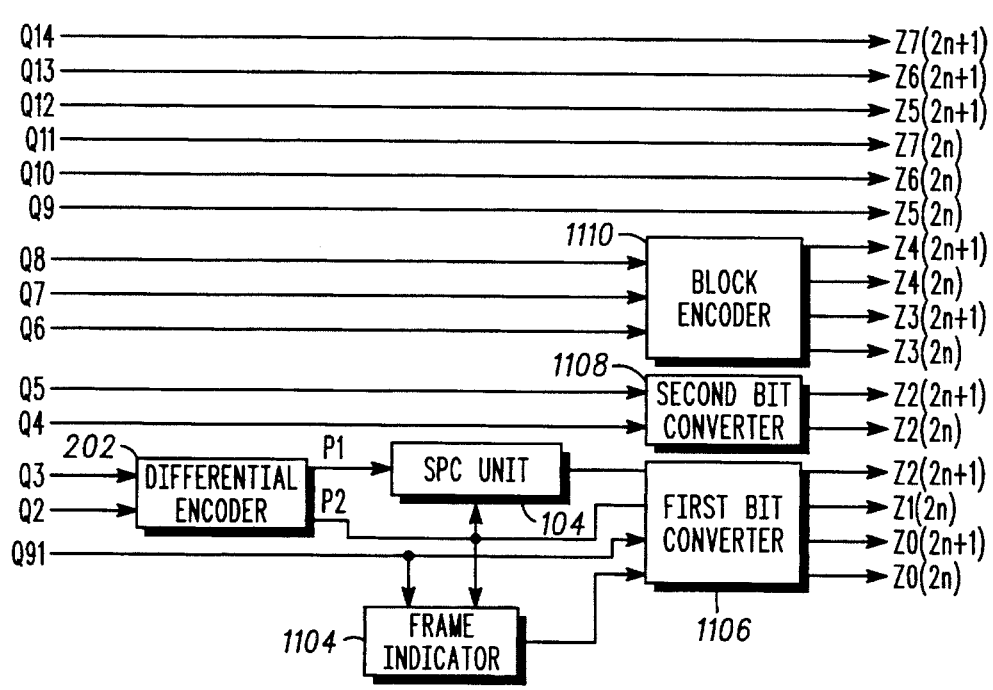
FIG. 11 is a block diagram of a multi-level trellis encoder utilized in a transmitter for encoding data sequences for transmission in a communication system in accordance with the present invention.

FIG. 11, numeral 1100, is a block diagram of a multi-level trellis encoder utilized in a transmitter for encoding data sequences for transmission in a communication system in accordance with the present invention. A 4-dimensional (4D)16-state Wei trellis encoder is utilized. In this code, single- (2D) and two-symbol (4D) error patterns are dominant, particularly in the presence of signal-dependent impairments such as nonlinear distortion and PCM noise. Coding of multiple frames is described, thus utilizing a frame indicator.

The differential encoder (202) utilizes a group of bits (Q2, Q3) to provide first and second sets of differentially encoded rotationally-significant label bits such that parity bit(s) provide a means for detecting errors in the first differentially encoded bits when the signal points are rotated by fixed, but unknown phase amount. A 16-state convolutional (conv.) encoder (1104) is operably coupled to receive and encode selected input bits (Q1, P2). A first bit converter (1106) is operably coupled to receive and convert the output bit(s) of the 16-state convolutional encoder (1104), selected input bit(s) (Q1) and output bits (P1, P2) of the differential encoder (202). A second bit converter (1112) is operably coupled to receive selected input bits (Q4, Q5) and to convert said bits as described below. A block encoder (1110) is operably coupled to receive and map selected input bits (Q6, Q7, Q8). Further input bits (Q9–Q14) are utilized for selecting indices, as described below.

Clearly, the SPC unit (104)in FIG. 11 includes the parity generating unit (304), and further includes, a frame indicator (302), as shown in FIG. 3. In the FIG. 11 implementation, the parity generating unit operates as follows: the 4D symbol intervals are indexed within an SPC frame from 0 to L−1, and accordingly represent the differentially-encoded rotationally-significant label bits P1 and P2 as P1(i) and P2(i), i=0, 1, . . . , L−1. The frame indicator keeps track of the index i. The parity-check bit P1(L−1) is then selected based on the following equation:

$$P1(L-1) = P = A \oplus \Sigma_{0 \leq i \leq L-2} P1(i) \oplus \Sigma_{0 \leq i \leq L-1} B(i)\, P2(i) \oplus \Sigma\Sigma_{0 \leq k,j \leq L-1} C(i,j) P2(i)\, P2(j) \quad (1)$$

where A, B(i) and C(i,j) are binary coefficients. The constant A can be chosen arbitrarily, i.e., A can be 0 or 1, or it can vary according to a pre-specified periodic pattern. The coefficients B(i) and C(i,j) are chosen carefully to ensure rotational invariance: C(i,j) are chosen such that, for any selected integer n, where $0 \leq n < L-1$, P2(n) appears in the second-order terms an odd number of times, and B(i) are chosen such that the total number of non-zero terms in the last two summations is even. It can be verified that whenever these conditions are satisfied, the parity-check equation (1) continues to hold in the presence of m·90° rotations, where m is an integer.

Since in (1), the parity bit P=P1(L−1) also depends on the last bit P2(L−1) of the frame, the encoder needs to first determine P2(L−1). Since in the differential encoder, any change in the input Q3(L−1) does not affect the output bit P2(L−1), this can be done, for example, by setting Q3(L−1) to 0 at the end of the frame, and then computing P2(L−1). Once P1(L−1) is determined, it replaces the temporary value computed for Q3(L−1)=0. In the receiver, Q3(L−1) is simply ignored.

The parity bit P does not need to be the last bit of a frame. The above parity equation is easily modified so that some other bit [e.g., P1(i), $0 \leq i < L-1$] is chosen as the parity bit. Of course, in this case, additional delays may be incurred, and therefore it is generally preferable to add the parity bit at the end of the frame.

There are at least two elements that differentiate the present invention from known conventional parity-check techniques. In the present invention, the parity check bit for a given bit sequence [e.g., P1 (i)] depends on another sequence [e.g., P2(i)], and moreover, this dependence is nonlinear [e.g., includes terms like P2(i)P2(j)]. It is the combination of these elements that ensures the desired rotational invariance. Obviously, there can be other ways for satisfying the condition for rotational-invariance set forth above. For example, it is possible to use parity-check equations whose terms have a higher order (higher than quadratic) to achieve a similar result.

As mentioned earlier, most single-symbol errors in the 4D 16-state Wei code can be detected and corrected by utilizing a single-parity-check (SPC) code. Similarly, most two-symbol errors can be detected and corrected using a second SPC code. In the discussion herein, the length of an SPC code is denoted as L, measured in number of four-dimensional symbols, and is the frame size of the SPC code, and is assumed to be even. This means, for each SPC, one parity bit will be added every L 4D symbols.

The frames of the two SPC's may be aligned, meaning they start in the same 4D symbol interval, or they may be offset with respect to one another. Here, unless indicated otherwise, the SPC frames will be assumed to be aligned.

The trellis encoder in FIG. 11 is arranged for sending 110 data bits for every L=8 4D symbols, or 13.75 bits per 2D symbol on average. With the addition of two parity bits every 8th 4D symbol for SPC's, the total number of bits transmitted becomes 112/8=14 bits per 4D symbol. These input bits are indicated in FIG. 9 as Q1, Q2, . . . , Q14.

The encoder shown in FIG. 11 encodes data mostly as in the original Wei code, except at the end of each SPC frame of L=8 4D symbols, the encoder may choose the bits Q3 and Q4 as parity bits (replacing data bits).

The redundancy of each SPC parity bit is ⅛ bit per 4D symbol, giving a total coding gain penalty of approximately 2×1.⅝=0.38 dB, assuming 1 additional bit per 4D costs 1.5 dB.

Figure 12:
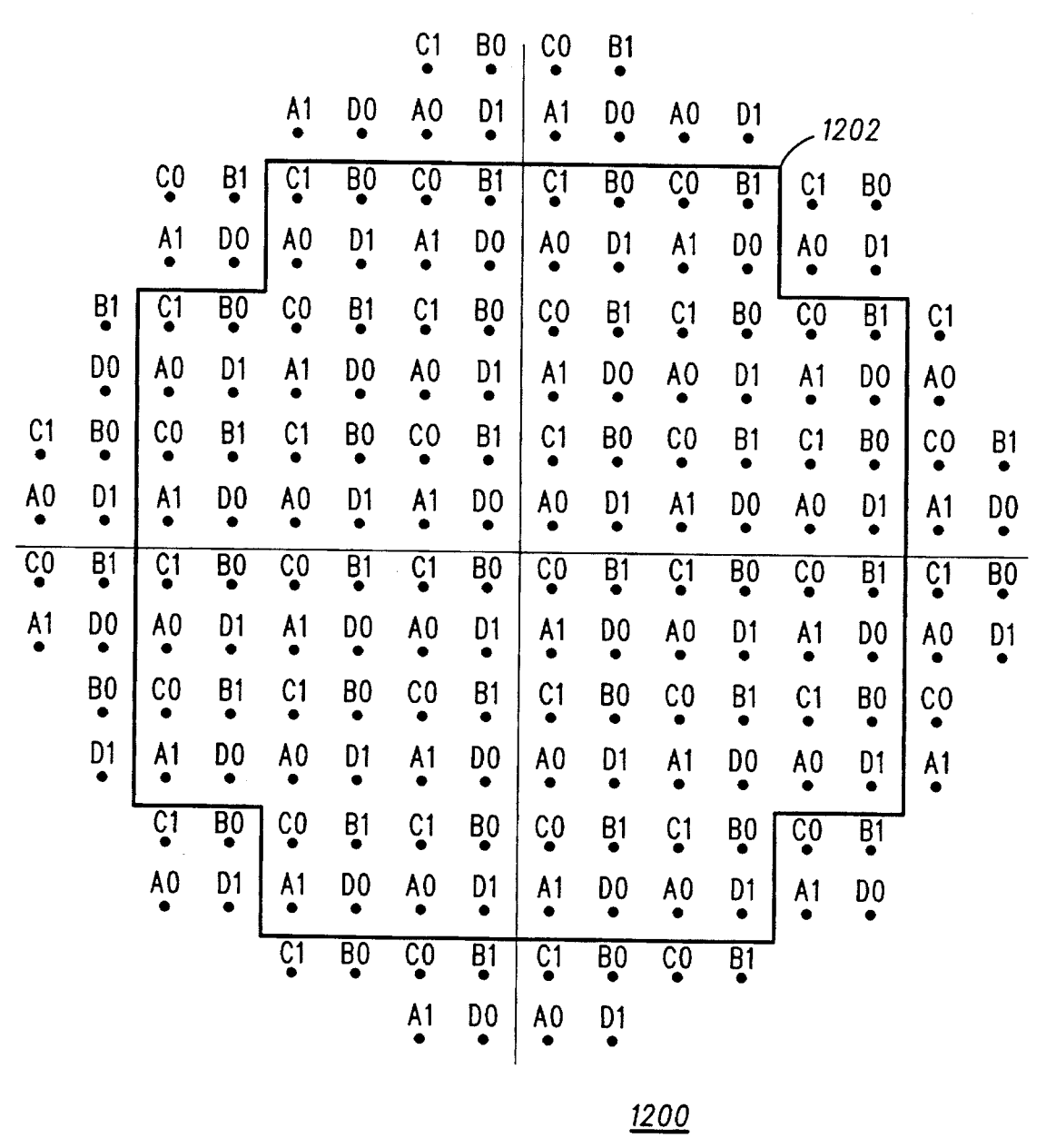

FIG. 12, numeral 1200, illustrates a 2D signal constellation with 192 points which lie on a rectangular grid. In a first embodiment, in accordance with the present invention, 2D signal points will be selected from this signal constellation. This constellation is partitioned into four subsets which are labelled as A, B, C and D. These subsets are further partitioned into even (0) and odd (1) types (e.g., A0, A1, B0, B1, etc.) such that, for an even 2D signal point, the nearest 2D signal point in the same subset is odd.

Figure 13:
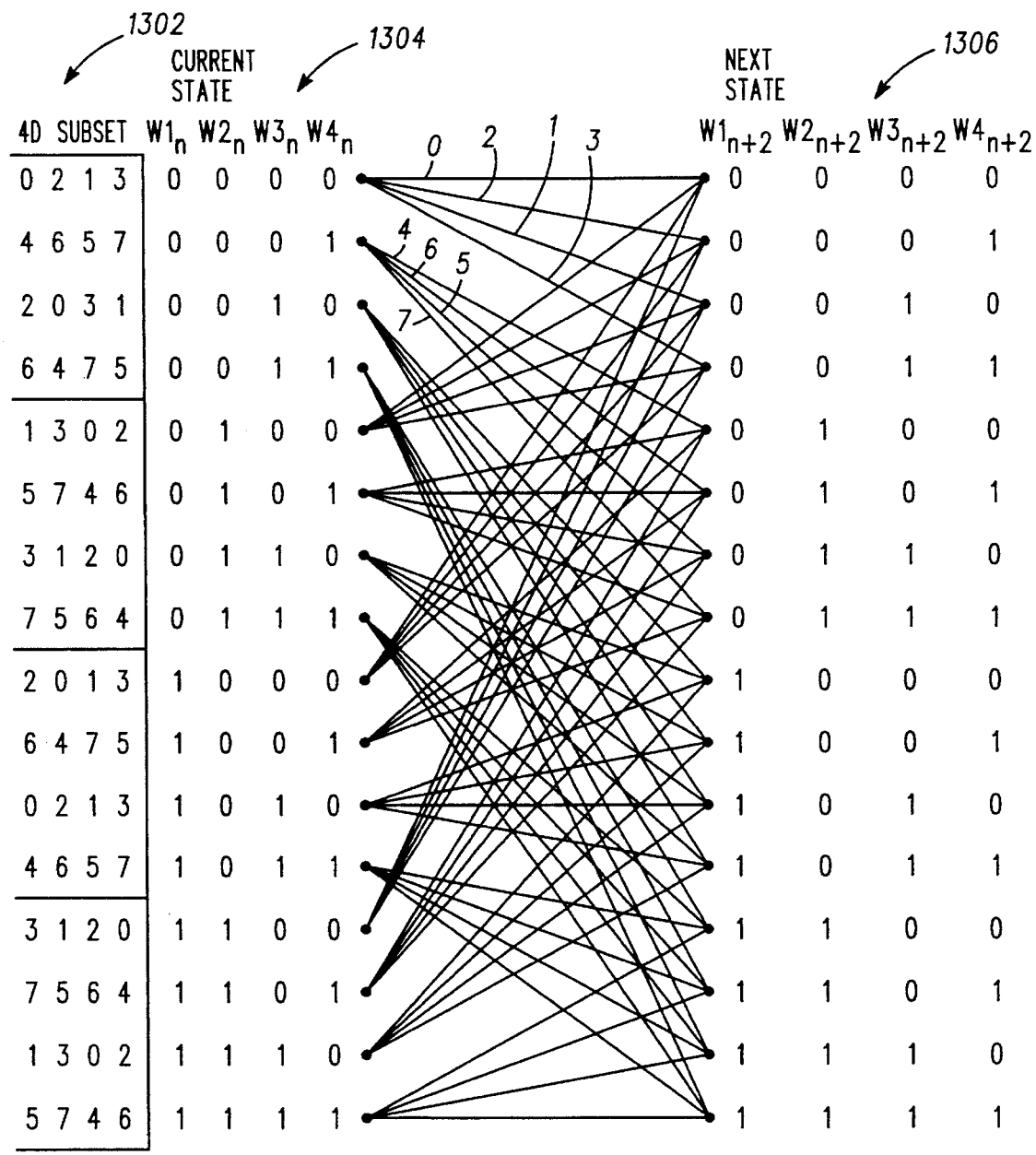
FIG. 13 illustrates a trellis diagram of the 4D 16-state Wei code utilized in FIG. 11.

It is possible to describe the parallel transition errors using lattice terminology. The 4D 16-state Wei trellis code is based on a 4D 8-way lattice partition Z4/RD4. Here $Z^4$ is the set of all integer 4-tuples. The signal points are chosen from the translate $Z^4+(0.5, 0.5, 0.5, 0.5)$, and $RD_4$ is a sublattice of $Z^4$ whose points are either of the type (A, A) or (B, B), where A and B indicate the 2D subsets shown in FIG. 12. The lattice R D4 has 8 cosets (translates) whose union form the lattice $Z^4$. These cosets can be specified by a pair of 2D subsets (e.g., A, A), as shown in Table 1. The trellis diagram of the 4D 16-state Wei code can then be drawn as shown in FIG. 13, numeral 1300, wherein the transitions from a current state (1304) to a next state (1306) are associated with a particular 4D subset (1302). The trellis diagram represents all sequences of cosets of $RD_4$ that belong to the trellis code.

TABLE 1

4D SUBSETS

| 4D Subset | Subset Types |
| --- | --- |
| 0 | (A, A) or (B, B) |
| 1 | (C, C) or (D, D) |
| 2 | (A, B) or (B, A) |
| 3 | (C, D) or (D, C) |
| 4 | (A, C) or (C, A) |
| 5 | (C, B) or (B, C) |
| 6 | (A, D) or (D, A) |
| 7 | (C, A) or (D, B) |

It can be seen that if a transmitted 2D symbol is in some 2D subset (e.g., A0), and a received 2D signal point is closer to a nearest incorrect 2D symbol in the same 2D subset (e.g., A1), a minimum-distance single-symbol error will occur, where the incorrect symbol is of a different (even/odd) type than the correct 2D symbol. Similarly, if a transmitted 4D symbol belongs to some 4D subset type [e.g., (A,A)] and a received 4D signal point is closer to a nearest incorrect 4D symbol that belongs to a different 4D subset type [e.g., (B,B)], a minimum-distance two-symbol error will occur. That these errors are minimum-distance errors can be seen by examining the entire distance structure of this code.

Data bits Q1 through Q14 determine a 4D signal point which will be transmitted as two successive 2D signal points. In the present invention, the 4D 16-state Wei trellis code is made transparent to m·90 degree rotations, where m is an integer, by including a differential encoder (202) in the parity device (1102). The differential encoder (202) operates on the bits Q3 and Q2 and produces differentially encoded bits P1 and P2 according to $$P1(n)P2(n)=P1(n-1)P2(n-1)+Q3(n)Q2(n) \quad (\text{mod } 4),$$

where all bit pairs are treated as integers mod 4, and the summation is also mod 4.

The differential encoder (202) is operably coupled to receive at least two data bits Q2 and Q3, and to output differentially encoded rotationally-significant label bits P2 and P1, respectively.

TABLE 2

FIRST BIT CONVERTER

| 4D Subset | Y0(n) | Q1(n) | P2(n) | P1(n) | 4D Types | Z0(2n) | Z1(2n) | Z0(2n + 1) | Z1(2n + 1) |
| --- | --- | --- | --- | --- | --- | --- | --- | --- | --- |
| 0 | 0 | 0 | 0 | 0 | (A, A) | 0 | 0 | 0 | 0 |
|   | 0 | 0 | 0 | 1 | (B, B) | 0 | 1 | 0 | 1 |
| 1 | 0 | 0 | 1 | 0 | (C, C) | 1 | 0 | 1 | 0 |
|   | 0 | 0 | 1 | 1 | (D, D) | 1 | 1 | 1 | 1 |
| 2 | 0 | 1 | 0 | 0 | (A, B) | 0 | 0 | 0 | 1 |
|   | 0 | 1 | 0 | 1 | (B, A) | 0 | 1 | 0 | 0 |
| 3 | 0 | 1 | 1 | 0 | (C, D) | 1 | 0 | 1 | 1 |
|   | 0 | 1 | 1 | 1 | (D, C) | 1 | 1 | 1 | 0 |
| 4 | 1 | 0 | 0 | 0 | (A, C) | 0 | 0 | 1 | 0 |
|   | 1 | 0 | 0 | 1 | (B, D) | 0 | 1 | 1 | 1 |
| 5 | 1 | 0 | 1 | 0 | (C, B) | 1 | 0 | 0 | 1 |
|   | 1 | 0 | 1 | 1 | (D, A) | 1 | 1 | 0 | 0 |
| 6 | 1 | 1 | 0 | 0 | (A, D) | 0 | 0 | 1 | 1 |
|   | 1 | 1 | 0 | 1 | (B, C) | 0 | 1 | 1 | 0 |
| 7 | 1 | 1 | 1 | 0 | (C, A) | 1 | 0 | 0 | 0 |
|   | 1 | 1 | 1 | 1 | (D, B) | 1 | 1 | 0 | 1 |

The bits Q1 and P2 are convolutionally encoded in a 16-state convolutional encoder (1104) to yield an additional coded bit Y0. Bits Q1, P2 and Y0 then determine the 4D subset, and P1 determines the odd/even type of the 4D subset explained above, as indicated in Table 2 above. The data bit Q4 determines the mod-2 sum of the odd/even types of the two 2D signal points in the 4D symbol interval.

The bits P2, Q1 and Y0, and the bit P1 after passing through the SPC unit (104), enter a first bit converter (1106), that operates in accordance with Table 2, set forth above. The outputs Z1(2n)Z0(2n) and Z1(2n+1)Z0(2n+1) of the bit converter select one of four subsets A=00, B=01, C=10, and D=11 for the signal points transmitted in symbol intervals 2n and 2n+1, respectively. These signal points are then transmitted using a carrier-modulated transmission system.

As illustrated in FIG. 11, two bits, Q4 and Q5, enter a second bit converter (1108) which produces the bits Z2(2n) and Z2(2n+1), as illustrated in Table 3 below. These bits determine the odd/even type of the 2D signal points.

TABLE 3

2ND BIT CONVERTER

| Q4 | Q5 | Z2(n + 1) | Z2(n) |
|----|----|-----------|----|
| 0 | 0 | 0 | 0 |
| 0 | 1 | 1 | 1 |
| 1 | 0 | 0 | 1 |
| 1 | 1 | 1 | 0 |

In one embodiment, 3 bits Q6, Q7 and Q8 enter a rate-¾ block coder (1110) to produce the bits Z4(2n+1)Z3(2n+1) and Z4(2n)Z3(2n), as illustrated in Table 4, set forth below. The signal constellation in FIG. 12 is partitioned into an inner region with 128 points (1202) and an outer region with 64 points. The bits Z4 Z3 select between the inner and outer regions, where a 10 selects an outer region, and 00 and 01 select the inner region. Note that Z4 Z3 never take the value 11; therefore, within a 4D symbol, two outer points are never used. This form of mapping is used to map a half-integer (i.e., 7.5) number of bits per 2D symbol over a 4D symbol interval. Other mapping techniques can also be used for this purpose.

TABLE 4

4D BLOCK ENCODER

| Q6 | Q7 | Q8 | Z3(2n) | Z4(2n) | Z3(2n + 1) | Z4(2n + 1) |
|----|----|----|----|----|----|----|
| 0 | 0 | 0 | 0 | 0 | 0 | 0 |
| 0 | 0 | 1 | 0 | 0 | 0 | 1 |
| 0 | 1 | 0 | 0 | 0 | 1 | 0 |
| 0 | 1 | 1 | 0 | 1 | 1 | 0 |
| 1 | 0 | 0 | 1 | 0 | 0 | 0 |
| 1 | 0 | 1 | 1 | 0 | 0 | 1 |
| 1 | 1 | 0 | 0 | 1 | 0 | 0 |
| 1 | 1 | 1 | 0 | 1 | 0 | 1 |

Together with the remaining 6 bits [Q9→Z5(2n), Q10→Z6(2n), Q11→Z7(2n), Q12→Z5(2n+1), Q13→Z6(2n+1), Q14→Z7(2n+1)], the 8-bit indices Z0(k)Z1(k)Z2(k)Z3(k)Z4(k) Z5(k)Z6(k)Z7(k) are formed, where k=2n, 2n+1, which specify the signal points to be transmitted. Note that the labelling is such that the bits Z2(2n) and Z2(2n+1) select between an odd 2D subset (e.g., A1) and an even 2D subset (e.g., A0). For example, if Z1(2n) Z0(2n)=00, and Z2(2n)=0, then the signal point in the symbol interval 2n will be selected from the subset A0 (an even 2D subset). On the other hand, if Z2(2n)=1, then the signal point will be selected from the subset A1 (an odd 2D subset). This modified form of labelling, necessary for SPC's in the present invention, is utilized herein.

To understand the role of the differential encoder (202), it should be noticed that according to Table 2 an m·90° rotation only affects the differentially-encoded bits P1 and P2; the remaining bits (Q1, Q4, Q5, . . . , Q14) are unaffected. Table 5 shows the effect of all four possible rotations on P1 and P2.

TABLE 5

EFFECT OF ROTATION ON BITS P1 and P2

| 0 degree | | 90 degree | | 180 degree | | 270 degree | |
|----|----|----|----|----|----|----|----|
| P1 | P2 | P1 | P2 | P1 | P2 | P1 | P2 |
| 0 | 0 | 0 | 1 | 1 | 0 | 1 | 1 |
| 0 | 1 | 1 | 0 | 1 | 1 | 0 | 0 |
| 1 | 0 | 1 | 1 | 0 | 0 | 0 | 1 |

TABLE 5-continued

EFFECT OF ROTATION ON BITS P1 and P2

| 0 degree | | 90 degree | | 180 degree | | 270 degree | |
|----|----|----|----|----|----|----|----|
| P1 | P2 | P1 | P2 | P1 | P2 | P1 | P2 |
| 1 | 1 | 0 | 0 | 0 | 1 | 1 | 0 |

This can be expressed in the following way:

$$P1P2 \rightarrow P1P2 + R1R2 \quad (\text{mod } 4)$$

where R1R2=01,10, or 11 for 90°, 180°, and 270° rotations, respectively. Stated in binary arithmetic, a rotation performs the following mapping:

90 degree rotation:
$P_2 \rightarrow \overline{P_2}$
$P_1 \rightarrow P_1 \oplus P_2$ 180 degree rotation:
$P_2 \rightarrow P_2$
$P_1 \rightarrow \overline{P_1}$ 270 degree rotation:
$P_2 \rightarrow \text{fheight } P2$
$P_1 \rightarrow P_1 \oplus \overline{P_2}$ where $\oplus$ represents a mod-2 sum, and the overbar represents a binary inversion.

It can be verified that if a valid sequence from the 4D Wei code is rotated by m·90°, another valid sequence will result. This property ensures that the trellis code can be made transparent to rotations of m·90°. However, when the trellis code is enhanced by parity-check codes, the resulting multilevel code may not be rotationally-invariant.

To describe how the parity check bit(s) are added, first, the following conventional way of parity checking that ensures rotational invariance for all rotations of m·180°, but not m·90°, where m is an integer, is described. Here, the encoder separately keeps track of the mod-2 sum of the bits P1 and Q4 over the entire SPC frame, and then selects the input bits Q3 and Q4 at the end of the frame such that both mod-2 checksums are equal to a pre-specified binary value A. For example, the checksum may always be forced to A=0 (or A=1), or A may vary according to a periodic pre-specified binary sequence. Equivalently, at the end of the frame, the encoder may select the input bit Q3 as a parity bit, instead of P1. The same end result will be achieved.

In the receiver, the resulting 4D 16-state Wei trellis code with the 2 SPC's can be decoded in a variety of ways. One popular method involves two-stage decoding, where generally a Viterbi decoder for the 4D 16-state Wei code first decodes the received symbols, and then the decoded parity is checked, separately for the decoded bits P1 and Q4.

If one single-symbol error is present in the SPC frame, the parity check for Q4 will fail, and the error is detected. To correct this error, the decoder must determine which of the 2L 2D symbols (here, L=8) in that SPC frame was in error and correct it to the next nearest 2D symbol in the same 2D subset. Thus, the 2L decoded points are examined and the signal point most likely to be in error is determined (that is, the received 2D point which is closest to a valid signal point with opposite parity), and then is changed to a closest 2D point in the same 2D subset. A reliability measure for the decoded 2D points and the corresponding second-choice 2D points can be determined and stored in a sequential manner during decoding or this can be done at the end of the SPC frame when a parity failure occurs.

Similarly, if one two-symbol error is present in the SPC frame, the parity check for P1 will fail, and the error is detected. Again to correct the error, the decoder must determine which of the L 4D symbols (e.g., L=8) in that SPC frame was in error and correct it to the next nearest symbol in the same 4D subset. Thus, the 4D point most likely to be in error is determined (that is, the received 4D point which is closest to a valid 4D point with opposite parity), and then is changed to the next closest 4D point in the same subset. Again, the reliability of the least reliable 4D point and the corresponding second-choice 4D point can be determined and stored in a sequential manner during decoding or this can be done once at the end of the frame when a parity failure occurs.

It is easy to verify (using the equations for rotations given earlier) that a 180° rotation will not affect the parity check-sums for P1 and Q4, and the following differential decoder will therefore ensure perfect recovery of the transmitted rotationally-significant bits Q3 and Q2.

$$Q3(n)Q2(n)=P1(n)P2(n)-P1(n-1) P2(n-1) \quad \text{(mod 4)}$$

Thus, the multi-level code is invariant to 180° rotations.

If there is a 90° or a 270° rotation, the checksum for Q4 is again unaffected. However, the checksum for the differentially-encoded bit P1 will fail (in the absence of any decoding errors), if the mod-2 checksum for the bit P2 is 1. Therefore, the multi-level code is not invariant to such rotations.

One way of dealing with this problem is to detect the presence of a 90° or 270° rotation in the receiver by monitoring the failure rate of the checksum for P1. If in a pre-specified number of successive SPC frames, the checksum for P1 fails when the checksum for P2 is 1, and it doesn't fail when the latter is 0, the receiver can declare a rotation, and will rotate the received constellation by 90°. Since the multi-level code is invariant to 180° rotations, this method will work regardless of the direction of the rotation (clockwise or counter-clockwise).

However, in some applications, it is preferable to make the multi-level code invariant to m·90° rotations, so that the additional detection and rotation steps in the receiver can be avoided. This can be achieved using the SPC unit (104) where the parity-check bit for the differentially-encoded bit P1 is determined as described earlier (see FIG. 2). Any of the methods described (FIGS. 4, 5, 6, 7, 8) would be applicable here.

Figure 14:
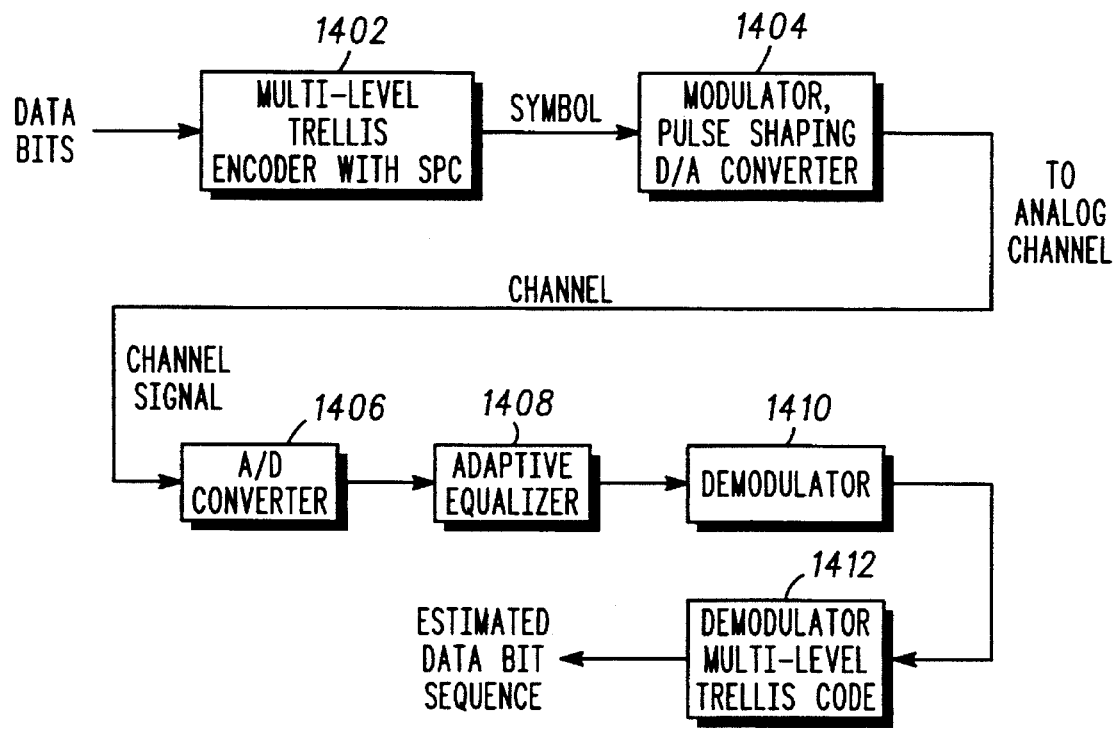
FIG. 14 is a block diagram of a multi-level trellis coded communication system having a parity check encoder in accordance with the present invention.

FIG. 14, numeral 1400, is a block diagram of a multidimensional, multi-level trellis coded communication system having a receiver with a decoding unit in accordance with the present invention. The system is a multi-level trellis-coded communication system for encoding a stream of input data bit sequences in a preselected multi-level code which includes at least one SPC code, transmitting the encoded data, and decoding the received data such that the parity check code can be decoded even in the presence of rotations. The system comprises: (1) a multi-level trellis encoder with at least one SPC (1402), for encoding the stream of input data bit sequences and to provide a rotationally-invariant multi-level code, comprising: (a) a differential encoder for utilizing at least two sets of data bits to generate at least first and second differentially-encoded rotationally-significant label bits and (b) an SPC unit, operably coupled to the differential encoder, for determining at least a first parity bit for the first differentially-encoded bits based at least on second differentially-encoded bits, said parity bit providing a means for detecting errors in the first differentially-encoded bits even when signal points are rotated, (c) a trellis encoder, for trellis-encoding at least some of the data bits, differentially-encoded data bits, or a combination thereof, (2) a modulator (1404), pulse-shaping filter and digital to analog (D/A) converter, operably coupled to receive the trellis-encoded signal points, for modulating and pulse-shaping said signal points to form an analog signal and transmitting said signal along a channel, (3) an analog to digital (A/D) converter (1406), operably coupled to receive the transmitted signal, for digitizing said signal, (4) an adaptive equalizer (1408), operably coupled to the A/D converter, for equalizing the digitized signal, (5) a demodulator (1410), operably coupled to the adaptive equalizer, for demodulating the equalized digitized signal, and (6) a decoder for a multi-level trellis code (1412), operably coupled to the demodulator, for decoding the demodulated equalized digitized signal to provide an estimated data bit sequence.

Although the preferred embodiment described in this specification used the 4D 16-state Wei code, the invention is also applicable to other trellis codes with SPC's (single parity check codes). For example, in FIG. 11 the Wei code uses a rate-⅔ convolutional encoder with only two input bits Q1 and P2. The invention can also be used with other trellis codes whose convolutional code is of a different rate. The convolutional encoder can also have different number of states. The method can also be used with codes of other dimensionality (e.g., N=2 or N=8). Mod-2 and mod-4 sums are performed as is known in the art. Also it is known in the field of art that a logic function may be implemented in many different ways. Any such variation should be regarded as equivalent to the present invention as long as the truth table is identical to one of the parity functions described in the present invention.

We claim:

1. A device for encoding a sequence of groups of label bits into a sequence of two-dimensional signal points, comprising:

(A) a mapper for mapping at least a group of n label bits into a sequence of two-dimensional signal points selected from a two-dimensional signal constellation according to a labelling wherein rotation of the signal constellation affects only p rotationally-significant label bits ($2 \leq p < n$; p, n integers) of the n label bits, (B) a convolutional encoder for a trellis code, operably coupled to receive and encode selected input bits, wherein a second rotationally-significant label bit is a coded bit for the trellis code, and (C) single-parity check code (SPC) means for generating a parity check bit for a first rotationally-significant label bit to allow the receiver to detect parallel transition errors in the trellis code, wherein the parallel transition errors are two-symbol errors, and wherein the parity-check bit is computed based on at least a second rotationally-significant label bit, such that the parity bit provides a means for detecting errors in the first rotationally-significant label bit even when the signal points are rotated by an unknown amount.

2. The device of claim 1 wherein the signal points of the two-dimensional signal constellation lie on a rectangular grid.

3. The device of claim 1 wherein the unknown rotation of signal points is one of: 90°, 180° and 270°.

4. The device of claim 1, wherein the trellis code is a 4-dimensional trellis code.

5. The device of claim 4 wherein the 4-dimensional trellis code is a 16-state code.

6. The device of claim 1, wherein the parity bit is computed according to a nonlinear function of a plurality of second rotationally-significant label bits.

7. The device of claim 6 wherein the nonlinear function is a quadratic function of the plurality of the second rotationally-significant label bits.

8. The device of claim 1 wherein the parity bit is determined by the SPC means according to a formula of a form:

$$P = A \oplus \Sigma_{0 \leq i \leq L-2} P1(i) \oplus \Sigma_{0 \leq i \leq L-1} B(i) P2(i) \oplus \Sigma\Sigma_{0 \leq i,j \leq L-1} C(i,j)\, P2(i)\, P2(j),$$

where A is a preselected binary constant, L is a frame length, i and j are integers, B(i) and C(i,j) are preselected binary constants, and P2(i), P2(j) represents a plurality of second rotationally-significant label bits and P1(i) represents a plurality of first rotationally-significant label bits, where C(i,j) are chosen such that for any integer n, where $0 \leq n < L-1$, P2(n) appears in the second-order terms an odd number of times, and B(i) are selected such that the total number of non-zero terms in the last two summations is even.

9. The device of claim 8 wherein C(i,j)=1 when i is odd and j=i−1, and B(i)−1 for even values of i.

10. The device of claim 8 wherein B(i)=1 for odd values of i, L is a multiple of 4.

11. The device of claim 1, further including a differential encoder, operably coupled to receive at least two data bits, for generating the p rotationally-significant bits.

12. The device of claim 11 wherein the SPC means is operably coupled to receive first and second sets of differentially encoded rotationally-significant label bits (P1, P2), and, at the end of the frame, the parity bit(s) is/are selected such that adjusted parity bit(s) is/are determined in accordance with a mod-2 sum that is equal to a binary value P, the parity generating unit comprising:

(A) a running sum unit, operably coupled to receive the first (P1) and second (P2) sets of differentially encoded rotationally-significant label data bits, for determining a running sum, being a mod-2 sum of a form:

$$\Sigma_{0 \leq i \leq L-2} P1(i)$$

where L is a frame length and i is an integer, (B) a quadratic function unit, operably coupled to receive the second differentially encoded rotationally-significant label bits, P2, for determining a quadratic function of the form:

$$\Sigma_{0 \leq i \leq L-1} B(i)\, P2(i) \oplus \Sigma\Sigma_{0 \leq i,j \leq L-1} C(i,j) P2(i)\, P2(j)$$

where B(i) are predetermined binary constants, C(i,j) are predetermined binary constants, i and j are integers, (C) an adjusted parity generator, operably coupled to the quadratic function unit and to the running sum unit, for mod-2 summing the outputs of the running sum unit and the quadratic function unit, and mod-2 summing a prespecified binary constant (A) to provide adjusted parity bit(s) to the differential encoder, the mod-2 summing being of a form:

$$\Sigma_{0 \leq n \leq L-1} P1(n) = P = A \oplus \Sigma_{0 \leq i \leq L-2} P1(i) \oplus \Sigma_{0 \leq i \leq L-1} B(i)\, P2(i) \oplus \Sigma\Sigma_{0 \leq k,j \leq L-1} C(i,j)\, P2(i)\, P2(j),$$

where A is a preselected binary constant, i and j are integers, B(i) and C(i,j) are preselected binary constants, and P2(i) and P2(j) represents the second differentially encoded data bits, such that B(i) and C(i,j) are selected to provide that, for any integer n, where $0 \leq n \leq L-1$, P2(n) appears in second-order terms an odd number of times, and B(i) are further selected such that the total number of terms in the two summations is even, and such that utilizing the adjusted parity bit(s) provides a frame of two-dimensional signal points that are rotationally invariant in a parity check.

13. The device of claim 12 wherein C(i,j)=1 for odd values of i, with j=i−1, and B(i)=1 for even values of n.

14. The device of claim 12 wherein B(i)=1 for odd values of n, L is a multiple of 4.

15. The device of claim 12 wherein the SPC means includes an odd indexed symbol running sum unit operably coupled to receive an odd-indexed data bit (Q3), for monitoring a running mod-2 sum of the bits of the frame and determining a parity bit such that $$Q3(L-1) = A \oplus Q_3(1) \oplus Q_3(3) \oplus \ldots \oplus Q_3(L-3),$$

where A is a preselected binary constant and $Q_3(1)$, $Q_3(3)$, ..., $Q3(L-3)$ are odd-indexed symbols for the input data bit Q3.

16. The device of claim 1 wherein parity is determined by one of:

(A) the SPC means utilizing a mod-2 sum of a form:

$$P1(L-1) = A \oplus \Sigma_{0 \leq n \leq L-2} P1(n) \oplus \Sigma\Sigma_{0 \leq i \leq L-1} P2(i)\, P2(j),\ i+1 < j < L-1$$

where n is a predetermined integer, L is a frame length, P2 represents the first differentially encoded bits, and P1 represents the second differentially encoded bits, (B) where L is a multiple of 4, or equivalently, a set of L quaternary numbers C(n)=2·P1(n)+P2(n), n=0, 1, ..., L−1, is defined, and a parity bit is selected such that the mod-4 sum of C(n) is one of: 0 and 1, and (C) where L is other than a multiple of 4, the code is constrained to be rotationally invariant by adding an odd number K (K an integer) of first order terms (since K+L(L−1)/2 is even).

17. A method for encoding a sequence of groups of label bits into a sequence of two-dimensional signal points, comprising the steps of:

(A) mapping at least a group of n label bits into a sequence of two-dimensional signal points selected from a two-dimensional signal constellation according to a labelling wherein rotation of the signal constellation affects only p rotationally-significant label bits ($2 \leq p < n$; p, n integers) of the n label bits, (B) utilizing a convolutional encoder for a trellis code, wherein the second rotationally-significant label bit is a coded bit for the trellis code, (C) generating a parity check bit for a first rotationally-significant label bit to allow the receiver to detect parallel transition errors in the trellis code, wherein the parallel transition errors are two-symbol errors, and wherein the parity-check bit is computed based on at least a second rotationally-significant label bit, such that the parity bit provides a means for detecting errors in the first rotationally-significant label bit even when the signal points are rotated by an unknown amount.

18. The method of claim 17 wherein the signal points of the two-dimensional signal constellation lie on a rectangular grid.

19. The method of claim 17 wherein the unknown rotation of signal points is one of: 90°, 180° and 270°.

20. The method of claim 20, wherein the trellis code is a 4-dimensional trellis code.

21. The method of claim 20 wherein the 4-dimensional trellis code is a 16-state code.

22. The method of claim 17, wherein, in the step of generating a parity check bit, the parity bit is computed according to a nonlinear function of a plurality of second rotationally-significant label bits.

23. The method of claim 22 wherein the nonlinear function is a quadratic function of the plurality of the second rotationally-significant label bits.

24. The method of claim 17 wherein, in the step of generating a parity check bit, the parity bit is determined by the SPC means according to a formula of a form:

$$P = A \oplus \Sigma_{0 \leq i \leq L-2} P1(i) \oplus \Sigma_{0 \leq i \leq L-1} B(i) \ P2(i) \oplus \Sigma\Sigma_{0 \leq i,j \leq L-1} C(i,j) \ P2(i) \ P2(j),$$

where A is a preselected binary constant, L is a frame length, i and j are integers, B(i) and C(i,j) are preselected binary constants, and P2(i), P2(j) represents a plurality of second rotationally-significant label bits and P1(i) represents a plurality of first rotationally-significant label bits, such that C(i,j) are chosen such that for any integer n, where $0 \leq n \leq L-1$, P2(n) appears in the second-order terms an odd number of times, and B(i) are further selected such that the total number of non-zero terms in the last two summations is even.

25. The method of claim 24 wherein C(i,j)=1 for odd values of i, with j=i−1, and B(i)=1 for even values of i.

26. The method of claim 24 wherein B(i)=1 for odd values of i, L is a multiple of 4.

27. The method of claim 17, further including the step of utilizing a differential encoder for generating the p rotationally-significant bits utilizing at least two input data bits.

28. A method for encoding a group of bits into a frame of two-dimensional signal points, comprising the steps of:

(A) generating first and second differentially-encoded rotationally significant label bits from at least two sets of data bits; and (B) determining at least a first parity bit for the first differentially-encoded rotationally significant label bits based at least on a nonlinear function of the second differentially-encoded rotationally significant label bits wherein the at least first parity bit provides for detecting parallel transition errors in a trellis code, wherein the parallel transition errors are two-symbol errors, such that the parity bit(s) enables detection of errors in the first differentially-encoded rotationally significant label bits even when signal points are rotated.

29. The method of claim 28, wherein the signal points of the two-dimensional signal constellation lie on a rectangular grid.

30. The method of claim 28 wherein the rotation of received signal points is one of: 90°, 180° and 270°.

31. The method of claim 28, wherein the trellis code is a 4-dimensional trellis code.

32. The method of claim 31 wherein the 4-dimensional code is a 16-state code.

33. The method of claim 28 wherein the differential encoder is a mod-4 sum differential encoder.

34. The method of claim 28 wherein the nonlinear function the parity bit is based on is a quadratic function of the first differentially-encoded rotationally significant bits.

35. The method of claim 28 wherein the first and second differentially encoded rotationally significant label bits are P1, P2 of the differential encoder and the parity bit is selected such that adjusted parity bit(s) is/are determined in accordance with a mod-2 sum that is equal to a binary value P which is determined in accordance with the second bits, P2, further including the steps of:

(A) determining a running sum, being a mod-2 sum of a form:

$$\Sigma_{0 \leq i \leq L-2} P1(i)$$

where L is a frame length and i is an integer, (B) determining a quadratic function of the form:

$$\Sigma_{0 \leq i \leq L-1} B(i) \ P2(i) \oplus \Sigma\Sigma_{0 \leq i,j \leq L-1} \ C(i,j) \ P2(i) \ P2(j)$$

where B(i) are predetermined binary constants, C(i,j) are predetermined binary constants, i and j are integers, (C) mod-2 summing the outputs of the running sum unit and the quadratic function unit, and mod-2 summing a prespecified binary constant (A) to provide adjusted parity bit(s) to the differential encoder, the mod-2 summing being of a form:

$$\Sigma_{0 \leq n \leq L-1} P1(n) = P = A \oplus \Sigma_{0 \leq i \leq L-2} P1(i) \oplus \Sigma_{0 \leq i \leq L-1} B(i) \ P2(i) \oplus \Sigma\Sigma_{0 \leq i,j \leq L-1} \ C(i,j) \ P2(i) \ P2(j)$$

where A is a preselected binary constant, i and j are integers, B(i) and C(i,j) are preselected binary constants, and P2(i) and P2(j), represent the second set of differentially encoded data bits, such that B(i) and C(i,j) are selected to provide P2(n) that, for any n=i, j, appears (non-zero) in second-order terms an odd number of times, and B(i) are selected such that the total number of terms in the two summations is even, and such that utilizing the adjusted parity bit(s) provides a frame of two-dimensional signal points that are rotationally invariant in a parity check.

36. The method of claim 35 wherein C(i,j)=1 for odd values of i, with j=i−1, and B(i)=1 for even values of n.

37. The method of claim 35 wherein B(i)=1 for odd values of n, L is a multiple of 4.

38. The method of claim 28 wherein the step of determining at least a first parity bit includes the step of utilizing an odd indexed symbol running sum unit operably coupled to receive an odd-indexed data bit (Q3), for monitoring a running mod-2 sum of the bits of the frame and determining a parity bit such that $$Q_3(L-1) = A \oplus Q_3(1) \oplus Q_3(3) \oplus \ldots \oplus Q_3(L-3),$$

where A is a preselected binary constant and $Q_3(1)$, $Q_3(3)$, ..., $Q_3(L-3)$ are odd-indexed symbols for the input data bit Q3.

39. The method of claim 28 wherein parity is determined by one of:

(A) utilizing the parity-equation in the following form:

$$P1(L-1) = P = A \oplus \Sigma_{0 \leq n \leq L-2} P1(n) \oplus \Sigma_{0 \leq k \leq L/2-1} \overline{P_2}(2K+1) \ P2(2k),$$

and recursively determining P1(L−1)=P, where A is a preselected binary constant, n and k are predetermined integers, L is a frame length, P1(n) is the first set of differentially encoded bits, P2(2k, 2k+1) are successive bits of the second set of differentially encoded bits, and P2 (2k+1) is the logical inversion of P2(2k+1), by the steps of:

(A1) at the start of a frame, setting P to a pre-specified binary value, which is denoted as A, (A2) In even numbered 4D intervals (n=0, 2, 4, 6, ...), recording the value of P2(n) for use in the next interval, and adjusting P according to P=P⊕P1(n), (A3) in odd numbered 4D intervals (n=1, 3, 5, or 7, ..., L-3), where P2(n)=0, then P=P⊕P2(n-1)⊕P1 (n), and where P2(n)=1, then P=P⊕P1(n), and (A4) at the end of a frame (n=L-1), selecting P such that:

where P2(L-2)=0, then P=P⊕P2(n-1), and where P2(L-2)=1, then P=P;

(B) utilizing a mod-2 sum of a form:

$$P1(L-1)=A \oplus \Sigma_{0 \leq n \leq L-2} P1(n) \oplus \Sigma\Sigma_{0 \leq i \leq L-1} P2(i) P2(j), _{i+1 \leq j \leq L-1}$$

where n is a predetermined integer, L is a frame length, P2 is the second set of differentially encoded bits, and P1 is the first set of differentially encoded bits, (C) where L is a multiple of 4, or equivalently, utilizing a set of L quaternary numbers C(n)=2·P1(n)+P2(n), n=0, 1, ..., L-1, is defined, and selecting a parity bit such that the mod-4 sum of C(n) is one of: 0 and 1, and (D) where L is other than a multiple of 4, constraining the code to be rotationally invariant by adding an odd number K (K an integer) of first order terms (since K+L(L-1)/2 is even).

40. A multi-level trellis-coded communication system for encoding a stream of input data bit sequences in a preselected multi-level code, transmitting encoded data, and decoding received data to provide a rotationally invariant parity check code, comprising:

(A) a multi-level trellis encoder with at least one SPC, for encoding the stream of input data bit sequences to provide a rotationally invariant multi-level code, comprising:

(1) a mapper for mapping at least a group of n label bits into a sequence of two-dimensional signal points selected from a two-dimensional signal constellation according to a labelling wherein rotation of the signal constellation affects only p rotationally-significant label bits (2≤p<n; p, n integers) of the n label bits, (2) a convolutional encoder for a trellis code, operably coupled to receive and encode selected input bits, wherein the second rotationally-significant label bit is a coded bit for the trellis code, (3) single-parity check code (SPC) means for generating a parity check bit for a first rotationally-significant label bit to allow the receiver to detect parallel transition errors in the trellis code, wherein the parallel transition errors are two-symbol errors, and wherein the parity-check bit is computed based on at least a second rotationally-significant label bit, such that the parity bit provides a means for detecting errors in the first rotationally-significant label bit even when the signal points are rotated by an unknown amount, (4) trellis encoder for encoding at least one of the data bits and rotationally-significant label bits, and (B) a modulator, pulse-shaping digital to analog (D/A) converter, operably coupled to receive trellis-encoded code, for modulating and pulse-shaping the code to form a signal and transmitting the signal along a channel, (C) an analog to digital (A/D) converter, operably coupled to receive the transmitted signal, for digitizing the signal, (D) an adaptive equalizer, operably coupled to the A/D converter, for equalizing the digitized signal, (E) a demodulator, operably coupled to the adaptive equalizer, for demodulating the equalized digitized signal, and (F) a decoder for multi-level trellis code, operably coupled to the demodulator, for decoding the demodulated equalized digitized signal to provide an estimated data bit sequence.

41. The system of claim 40, wherein the signal points of the two-dimensional signal constellation lie on a rectangular grid.

42. The system of claim 40 wherein the unknown rotation of signal points is one of: 90°, 180° and 270°.

43. The system of claim 40, wherein the trellis code is a 4-dimensional trellis code.

44. The system of claim 43 wherein the 4-dimensional trellis code is a 16-state code.

45. The system of claim 40, wherein the parity bit is computed according to a nonlinear function of a plurality of second rotationally-significant label bits.

46. The system of claim 45 wherein the nonlinear function is a quadratic function of the plurality of the second rotationally-significant label bits.

47. The system of claim 40 wherein the parity bit is determined by the SPC means according to a formula of a form:

$$P=A \oplus \Sigma_{0 \leq i \leq L-2} P1(i) \oplus \Sigma_{0 \leq i \leq L-1} B(i) P2(i) \oplus \Sigma\Sigma_{0 \leq i,j \leq L-1} C(i,j) P2(i) P2(j),$$

where A is a preselected binary constant, L is a frame length, i and j are integers, B(i) and C(i,j) are preselected binary constants, and P2(i), P2(j) represents a plurality of second rotationally-significant label bits and P1(i) represents a plurality of first rotationally-significant label bits, and where C(i,j) is chosen such that for any integer n, where 0 ≤n≤L-1, P2(n) appears in the second-order terms an odd number of times, and B(i) are further selected such that the total number of non-zero terms in the last two summations is ever.

48. The system of claim 47 wherein C(i,j)=1 for odd values of i, with j=i-1, and B(i)=1 for even values of i.

49. The system of claim 48 wherein B(i)=1 for odd values of i, L is a multiple of 4.

50. The system of claim 40, further including a differential encoder, operably coupled to receive at least two data bits, for generating the p rotationally-significant bits.

* * * * *

UNITED STATES PATENT AND TRADEMARK OFFICE
CERTIFICATE OF CORRECTION

PATENT NO. : 5,535,228
DATED : July 9, 1996
INVENTOR(S) : Ping Dong, M. Vedat Eyuboglu, Geroge D. Forney, Jr.

It is certified that error appears in the above-indentified patent and that said Letters Patent is hereby corrected as shown below:

Column 15, Line 64"k" should be --i--

Column 20, LIne 54, "ever" should be --even--

Signed and Sealed this

First Day of October, 1996

Attest:

BRUCE LEHMAN

Attesting Officer         Commissioner of Patents and Trademarks